United States Patent [19]

Hoenlein et al.

[11] Patent Number: 5,529,950
[45] Date of Patent: Jun. 25, 1996

[54] METHOD FOR MANUFACTURING A CUBICALLY INTEGRATED CIRCUIT ARRANGEMENT

[75] Inventors: Wolfgang Hoenlein, Unterhaching; Siegfried Schwarzl, Neubiberg, both of Germany

[73] Assignee: Siemens Aktiengesellschaft, Munich, Germany

[21] Appl. No.: 377,049

[22] Filed: Jan. 23, 1995

[30] Foreign Application Priority Data

Feb. 7, 1994 [DE] Germany .......................... 44 03 736.8

[51] Int. Cl.$^6$ .......................... H01L 21/288; H01L 21/60
[52] U.S. Cl. .......................... 437/170; 437/203; 437/208; 437/225; 437/915; 437/974; 205/656; 205/665
[58] Field of Search ..................... 437/974, 170, 437/203, 208, 225, 974, 915; 204/129.3, 129.55; 257/686, 777

[56] References Cited

U.S. PATENT DOCUMENTS

| | | | |
|---|---|---|---|
| 4,437,109 | 3/1984 | Anthony et al. | 174/68.5 |
| 4,667,220 | 5/1987 | Lee et al. | 357/68 |
| 4,893,174 | 1/1990 | Yamada et al. | 357/68 |
| 4,939,568 | 7/1990 | Kato et al. | 357/68 |
| 5,153,814 | 10/1992 | Wessely | 361/382 |
| 5,244,817 | 9/1993 | Hawkins et al. | 437/2 |
| 5,262,021 | 11/1993 | Lehmann et al. | 204/129.55 |
| 5,306,647 | 4/1994 | Lehmann et al. | 437/2 |
| 5,360,759 | 11/1994 | Stengl et al. | 437/20 |
| 5,401,672 | 3/1995 | Kurtz et al. | 437/915 |
| 5,403,752 | 4/1995 | Bruchhaus et al. | 437/3 |
| 5,426,072 | 6/1995 | Finnila | 437/208 |

FOREIGN PATENT DOCUMENTS

| | | |
|---|---|---|
| 0213774 | 3/1987 | European Pat. Off. . |
| 4202455 | 8/1993 | Germany . |

OTHER PUBLICATIONS

"Laser dye impregnation of oxidized porous silicon wafers", L. T. Canham, Appl. Phys. Lett. 63 (3), Jul. 19, 1993, pp. 337–339.

"Fabrication of Three–Dimensional IC Using Cumulatively Bonded IC (CUBIC) Technology", Y. Hayashi et al., IEEE Symposium on VLSI Technology, pp. 95–96, 1990 (Best Date Available).

*Primary Examiner*—George Fourson
*Assistant Examiner*—David E. Graybill
*Attorney, Agent, or Firm*—Hill, Steadman & Simpson

[57] ABSTRACT

A method used in manufacturing a cubically integrated circuit arrangement. A silicon wafer, wherein through pores are produced by electrochemical etching are insulated from the silicon wafer, and are provided with conductive fills, is secured as a carrier plate (24) to a substrate (21) that has components and that is integrated in a cubically integrated circuit arrangement. Terminal pads (25) that are electrically connected to conductive fills and that are arranged on the surface of the carrier plate (24) thereby meet contacts (23) to the components that are arranged at the surface of the substrate (21) adjoining the carrier plate (24) and that are firmly connected thereto.

20 Claims, 2 Drawing Sheets

METHOD FOR MANUFACTURING A CUBICALLY INTEGRATED CIRCUIT ARRANGEMENT

BACKGROUND OF THE INVENTION

In cubic integration, a plurality of substrates are stacked on top of one another and firmly connected to one another. The individual substrates thereby each respectively have integrated circuits, sensor-actuator arrangements and/or planar passive components. The individual substrates can thereby be manufactured in different technologies. The components contained in the various substrates are electrically connected to one another by vertical contacts.

The substrates are first manufactured independently of one another in the manufacture of such a cubically integrated circuit arrangement. The substrates manufactured independently of one another are then extremely thinned, down to approximately 10 µm. The thinned substrates have their front side and back side provided with electrical contacts and are arranged above one another such that mechanical and thermal demands are also met in addition to the electrical demands of the circuit arrangement. The circuit arrangement must be mechanically stable, whereby extreme mechanical stresses should be avoided. Further, the dissipated heat that increases with increasing integration must be eliminated.

In a reference Y. Hayashi et al, Symp. on VLSI Technol. (1990) pages 95 ff it is disclosed that the processed front side of a substrate be protected in cubic integration during thinning and during the further process steps in that a solid carrier layer of, for example, silicon or quartz is glued onto the front side of the substrate. The substrate is then thinned and provided with contacts proceeding from the back side. Subsequently, the thinned substrate is applied onto a further substrate and is firmly connected thereto in a bonding process. After the bonding process, the carrier layers must in turn be stripped off without damaging the components in the substrates or undoing the connection between the substrates. A testing of the components in the thinned substrate is only possible proceeding from the back side before the bonding process since the carrier layer covers the front side and thinned substrates do not withstand standard testing procedures without stabilizing carrier layer. Both-sided contacting, however, is required when testing non-autonomous ICs such as, for example, for the inner levels of a memory stack. Numerous process steps are required for producing contacts and metallization structures on the back side of the thinned substrates.

SUMMARY OF THE INVENTION

It is an object of the present invention to provide a method for manufacturing a cubically integrated circuit arrangement wherein a testing of thinned substrates is possible proceeding from both sides.

In general terms the present invention is a method for manufacturing a cubically integrated circuit arrangement. Through pores are produced in a doped monocrystalline silicon wafer by electrochemical etching in a fluoride-containing, acidic electrolyte wherein the silicon wafer is connected as anode. The through pores, insulated from the silicon wafer, are at least partially provided with conductive fills. The silicon wafer, as carrier plate, is secured on a first principal surface of a substrate, which has components at least in the region of the first principal surface, which has contacts to the components on the first principal surface, and which is integrated in the cubically integrated circuit arrangement in common with other substrates. Terminal pads that are electrically connected to at least one conductive fill and that meet at least one contact on the first principal surface are formed on the surface of the carrier plate adjoining the first principal surface. The terminal pads are firmly joined to the respective contacts.

Advantageous developments of the present invention are as follows.

The silicon wafer is thinned by chemical-mechanical polishing.

The carrier plate has a thickness between 100 µm and 300 µm, and the pores have diameters between 1 µm and 10 µm.

The entire surface of the silicon wafer is provided with the insulating material after the manufacture of the pores. The conductive fills are produced of doped polysilicon, aluminum, copper or of amalgam constituents.

The substrate is thinned proceeding from a second principal surface that lies opposite the first principal surface. Contacts that are electrically connected to components in the region of the first principal surface of the substrate are produced on the second principal surface of the substrate.

A further carrier plate, that is provided with pores provided with conductive fills essentially in the same way as the first-cited plate, is secured on a first principal surface of a further substrate. The further substrate has components in the region of the first principal surface has contacts to the components on the first principal surface. Terminal pads, that are electrically connected to at least one conductive fill and that respectively meet at least one contact on the first principal surface and that are firmly joined to the contacts, are formed at least on that surface of the further carrier plate adjoining the first principal surface of the further substrate. The further substrate is thinned proceeding from a second principal surface that lies opposite the first principal surface. Contacts that are electrically connected to components in the region of the second principal surface of the further substrate are produced on the second principal surface of the further substrate. The first-cited carrier plate is secured on the second principal surface of the further substrate such that the first-cited substrate and the further substrate are arranged at opposite sides of the first-cited carrier plate. The terminal pads, that are electrically connected to at least one conductive fill and that respectively meet at least one contact on the second principal surface of the further substrate and that are firmly joined to the respective contacts, are formed on that surface of said first-cited carrier plate adjoining the second principal surface of the further substrate. At least some of the terminal pads of at least one of the carrier plates are structured such that they are electrically connected to conductive fills of neighboring pores, so that these are connected in parallel. At least one of the carrier plates projects laterally beyond at least one of the neighboring substrates. The laterally projecting carrier plate has at least one terminal contact in the laterally projecting part that is connected via a metallization level to components in at least one of the substrates.

In the method of the present invention, a doped, monocrystalline silicon wafer is employed as carrier plate, through pores having been generated therein previously by electromechanical etching in a fluoride-containing, acidic electrolyte wherein the silicon wafer is connected as anode. The pores have diameters in the range from 1 through 10 µm. Such porous silicon is generally referred as macroporous. At least some of the pores are provided with an insulating layer on their surface and are filled with conductive fills.

Preferably, the entire surface of the silicon wafer is provided with an insulating layer, for example by thermal oxidation. The carrier plate is secured on a first principal surface of a substrate that has components at least in the region of the first principal surface and that is integrated in the cubically integrated circuit arrangement in common with other substrates. Contacts to the components are arranged on the first principal surface. Terminal pads, that are each respectively electrically connected to at least one conductive fill, are formed at least at the surface of the carrier plate adjoining the first principal surface of the substrate. These terminal pads respectively meet at least one contact on the first principal surface of the substrate. Terminal pads and contacts that meet one another are firmly joined to one another and represent the fixed connection between the carrier plate and the substrate. The conductive fills are preferably produced from doped polysilicon, aluminum, copper or amalgam constituents. The contacts are preferably produced of tungsten, Au/In or amalgam constituents. The connection between the terminal pads and the contacts preferably ensues by soldering or amalgamation.

The carrier plate of macroporous silicon has high mechanical stability, so that it stabilizes the substrate during thinning and further processing. Even after thinning, a testing of the components in the substrate is possible proceeding from both sides via the conductive fills in the pores of the carrier plate. As arranged, terminal pads are additional formed on the surface of the carrier plate facing away from the substrate. The carrier plate of macroporous silicon has an adequate mechanical stability even given a thickness of 100 through 200 µm.

It lies within the scope of the present invention to employ the carrier plate as connecting element between neighboring substrates of a cubically integrated circuit arrangement. To that end, the carrier plate is provided with corresponding terminal pads at opposite sides. The vertical contacting of the various substrates of the cubically integrated circuit arrangement ensues via the conductive fills of the carrier plate. For setting the resistance and capacitance of such connections, the selection of the material for the conductive fills is suitable on the one hand and a parallel connection of a plurality of pores is suitable on the other hand. Since the carrier plates are essentially symmetrically constructed, thermal warpings are largely avoided.

It lies within the scope of the present invention to arrange the carrier plates such that they are suitable for the elimination of dissipated heat. To that end, the carrier plates are particularly arranged such that they partially laterally project beyond neighboring substrates and have a thermal connection to cooling devices.

Laterally projecting parts of carrier plates can be additionally provided with terminal contacts that are connected via a metallization level to components in at least one of the substrates. For example, supply voltages can be applied or test measurement implemented via such terminal contacts.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENT

Figure 1:
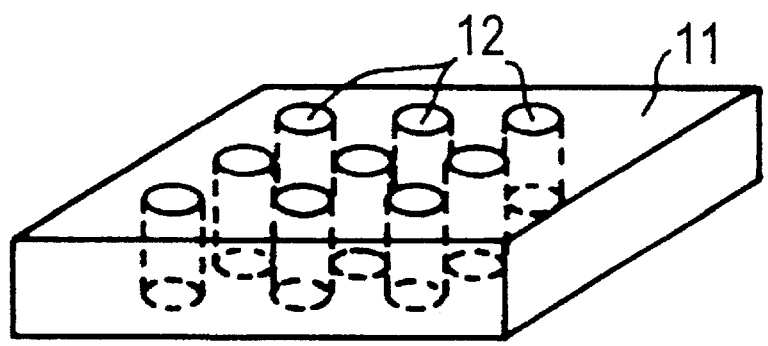
FIG. 1 shows a carrier plate.

In a silicon wafer 11 of n-doped, monocrystalline silicon having <100> orientation, pores 12 are produced by electrochemical etching (see FIG. 1). To that end, the silicon wafer has a surface brought into contact with a fluoride-containing, acidic electrolyte. The electrolyte contains a hydrofluoric acid concentration of 1 through 50 percent, preferably 6 percent. Erecting agent ("Tensid") can be added to the electrolyte in order to suppress the formation of hydrogen bubbles on the surface of the silicon wafer 11. A voltage of, for example, 3 volts is applied between the silicon wafer 11 and the electrolyte. The silicon wafer 11 that, for example, has a specific resistance of 5 ohms×cm is connected as anode. The silicon wafer 11 is illuminated proceeding from the back side. Due to the illumination, a current density of approximately 10 mA per $cm^2$ is set in the silicon wafer 11.

In the electromechanical etching, minority charged carriers move in the silicon to the surface having contact with the electrolyte. A space charge zone is formed at this surface. Since the field strength is greater in the region of depressions that are present with statistical distribution in every surface or are intentionally produced by a photo technique and an alkaline etchant then outside such depressions, the minority charged carriers move to these points with priority. As a result thereof, a structuring of the surface arises. All the more minority charged carriers move to a location and the etching attack is all the more pronounced at this location the more deeply an initially small irregularity becomes due to the etching. In this way, pores grow in <100> into a depth that is prescribed, among other things, by the etching time.

In the method of the present invention, the pores 12 cross through the entire silicon wafer 11. Given a thickness of the silicon wafer 11 of 100 µm, an etching time of approximately two hours is required for this purpose. The diameter of the pores is thereby set to a value between 1 µm and 10 µm.

Figure 2:
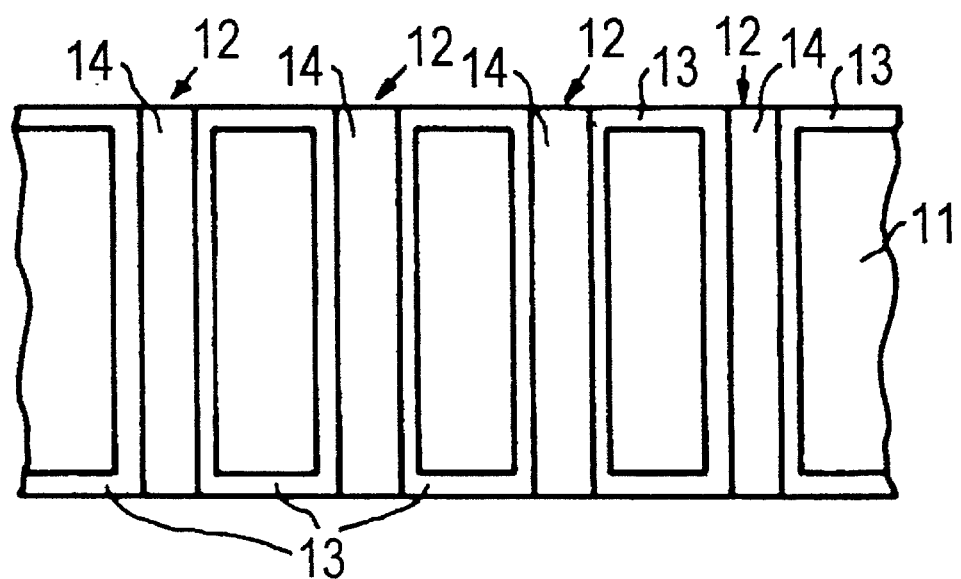
FIG. 2 shows a section through the FIG. 1 carrier plate.

The through pores in the silicon wafer 11, insulated from the silicon wafer 11 by an insulating layer 13, are provided with conductive fills 14 (see FIG. 2). The insulating layer 13 is preferably formed over the entire surface of the silicon wafer 11 by thermal oxidation.

The conductive fills 14 are produced, for example, of doped polysilicon, aluminum, copper or of amalgam constituents. What are to be understood by amalgam constituents are materials whereof one constituent is solid and the other constituent is liquid, whereby the solid constituent dissolves in the liquid constituent, this leading to a hardening of the mixture. The conductive fills 14 are introduced into the pores 12 in, preferably, the following way:

a) by conformal, surface-wise deposition by, for example, CVD with subsequent, planarizing re-etching, for example by plasma etching or chemical-mechanical polishing (CMP); or b) by selective deposition (CVD, electroless plating) on an auxiliary substrate.

The silicon wafer 11 having the through pores 12 that, insulated from the silicon wafer 11 are provided with the conductive fills 14, is employed as a carrier plate in the manufacture of a cubically integrated circuit arrangement.

Figure 3:
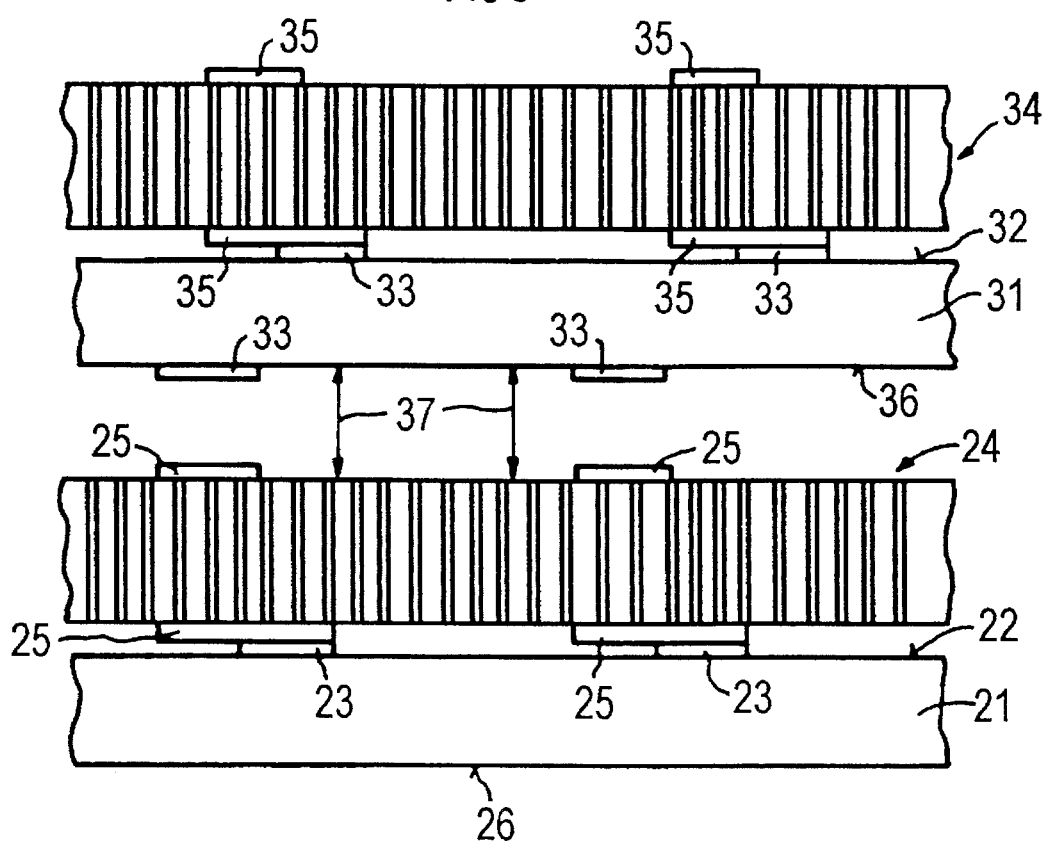
FIG. 3 shows the structure of a cubically integrated circuit arrangement having two substrates.

For manufacturing a cubically integrated circuit arrangement, one proceeds from a first substrate 21 that has a first principal surface 22 (see FIG. 3). The first substrate 21 has components in the region of the first principal surface 22. Contacts 23 to the components that are not shown in detail for the sake of clarity are arranged on the first principal surface 22. A first carrier plate 24 that is constructed of a macroporous silicon wafer have through pores that, insulated from the silicon wafer, are provided with conductive fills is applied onto the first substrate 21. Previously, terminal pads 25 that are each respectively electrically connected to at least one conductive fill of the carrier plate 24 are produced at least on the surface of the carrier plate 24 adjoining the first principal surface 22. Over and above this, the terminal pads 25 are mechanically firmly joined to the first carrier plate 24. The terminal pads 25 are composed, for example, of a metallization such as tungsten, aluminum, amalgam constituents. The terminal pads 25 meet contacts on the first principal surface 22 wherein the first carrier plate 24 is joined with the first substrate 21. A firm connection between the respectively meeting contacts 23 and terminal pads 24 is produced. This ensues, for example, by soldering or by amalgamation. The first carrier plate 24 is thermally joined to the first substrate 21 via this firm connection.

The components can be tested via the conductive fills in the first carrier plate 24 that are connected via the terminal pads 25 and the contacts 23 to the respective components in the first substrate 21. In order to facilitate contacting, terminal pads 25 that are in communication with the respective conductive fills are likewise produced on that surface of the first carrier plate 24 facing from the first substrate 21.

As a result of the high mechanical stability of macroporous silicon, a thickness of 100 through 200 μm perpendicularly relative to the first principal surface 22 of the first carrier plate 24 is adequate in order to stabilize the first substrate 21 during further processing. The thickness of the carrier plate 24 is preferably set for chemical-mechanical polishing. Included in the further processing in cubic integration is grinding a second principal surface 26 thin, this lying opposite the first principal surface 22, as is the application of contacts onto the second principal surface 26.

A second substrate 31 comprises components in the region of a first principal surface 32, contacts 33 for these components being arranged on the first principal surface 32 (see FIG. 3). A second carrier plate 34 is applied onto the second substrate, this second carrier plate 34 being composed of a macroporous silicon wafer having through pores, whereby the pores, insulated from the silicon wafer, are provided with conductive fills. Terminal pads, each of which are respectively electrically connected to at least one conductive fill of the second carrier plate 35, are applied on the surface of the second carrier plate 34 adjoining the first principal surface 32 of the first substrate 31. During joining, the terminal pads 35 respectively meet a contact 33 on the first principal surface 32 of the second substrate 31. For improved contactability of the conductive fill in the carrier plate 34, terminal pads to the corresponding conductive fills are likewise applied on that surface of the second carrier plate 34 facing away from the second substrate 31.

The second substrate 31 is thinned proceeding from a second principal surface 36 that lies opposite the first principal surface 32, here preferably by lapping, wet-chemical spin etching or chemical-mechanical polishing. Subsequently, contacts 33 are applied onto the second principal surface 36.

For integration of the first substrate 21 and of the second substrate 31 in a cubically integrated circuit arrangement, the second substrate 31 is applied onto that surface of the first carrier plate 24 facing away from the first substrate 21. This motion is indicated by the double arrows 37 in FIG. 3. The contacts 33 on the second principal surface of the second substrate 31 thereby meet terminal pads 25 of the carrier plate 24. The contacts 33 are firmly joined to the terminal pads 25 by soldering or amalgamation. This fixed connection simultaneously represents the connection between the second substrate 31 and the first carrier plate 24. In this way, the first substrate 21 and the second substrate 31 are both mechanically as well as electrically connected to one another via the first carrier plate 24. For reinforcing the mechanical strings, dummy contacts 33 and dummy terminal pads 25 can be applied that are electrically insulated from the components on the substrates 21, 31 and/or grooved connections can be employed.

For constructing more complex, cubically integrated circuit arrangements, further substrates are applied onto the second carrier plate in an analogous way, i.e. with further carrier plates, and are firmly joined.

Figure 4:
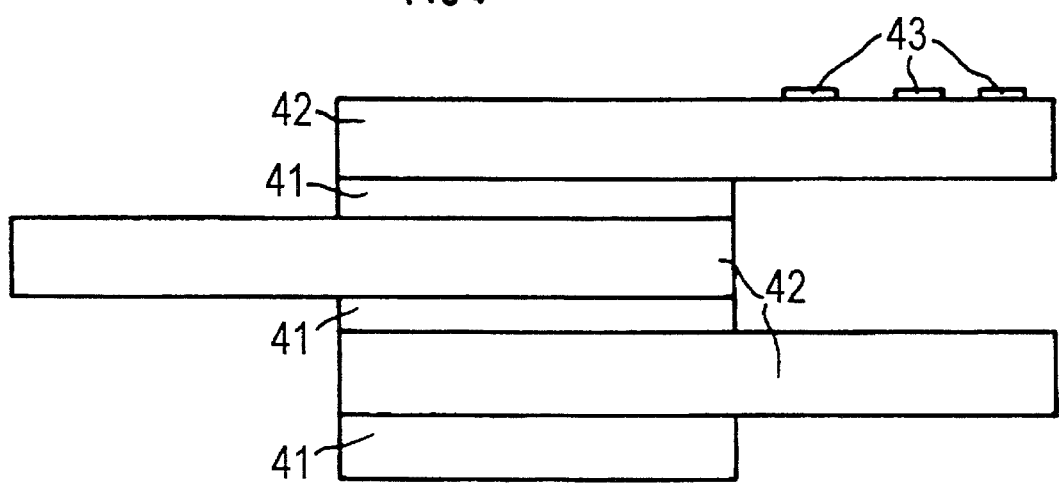
FIG. 4 shows a section through a cubically integrated circuit arrangement.

FIG. 4 shows a cubically integrated circuit arrangement wherein three substrates 41 are joined to one another via carrier plates 42 according to the method of the invention. The carrier plates 42 are constructed as set forth with reference to FIGS. 1 and 2. The carrier plates 42 laterally project beyond the substrates 41. In this way, heat generated by dissipated power is laterally eliminated. Over and above this, terminal contacts 43 are applied in the laterally projecting part of the carrier plates 42, supply voltages, for example, being applied and test measurements being capable of being carried out thereat.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for manufacturing a cubically integrated circuit arrangement, comprising the steps of:

producing through pores in a doped monocrystalline silicon wafer by electrochemical etching in a fluoride-containing, acidic electrolyte wherein the silicon wafer is connected as an anode;

at least partially providing said through pores, insulated from the silicon wafer by insulating material, with conductive fills;

securing the silicon wafer, as a first carrier plate, on a first principal surface of a first substrate, the first substrate having components at least in a region of the first principal surface, the first substrate having contacts to the components on the first principal surface; and forming terminal pads, that are electrically connected to at least one conductive fill and that meet at least one contact on the first principal surface, on a surface of the carrier plate adjoining the first principal surface, said terminal pads being joined to the contacts on the first substrate.

2. The method according to claim 1, wherein the silicon wafer is thinned by chemical-mechanical polishing.

3. The method according to claim 1, wherein the carrier plate has a thickness between 100 μm and 300 μm, and wherein the pores have diameters between 1 μm and 10 μm.

4. The method according to claim 1, wherein the method further comprises:

provideng the entire surface of the silicon wafer with the insulating material after the manufacture of the pores; and producing the conductive fills from fills that are selected from the group of doped polysilicon, aluminum, copper and amalgam constituents.

5. The method according to claim 1, wherein the method further comprises:

thinning the first substrate proceeding from a second principal surface that lies opposite said first principal surface of the first substrate; and producing contacts that are electrically connected to components in the region of the first principal surface of the first substrate on the second principal surface of the first substrate.

6. The method according to claim 1, wherein the method further comprises:

securing a second carrier plate that is provided with pores provided with conductive fills substantially in the same way as the first carrier plate, on a first principal surface of a second substrate, the second substrate having components in the region of the first principal surface of the second substrate and having contacts to the components on the first principal surface of the second substrate; and forming terminal pads that are electrically connected to at least one conductive fill, that meet at least one contact on the first principal surface of the second substrate, and that are joined to said at least one contact, at least on that surface of the second carrier plate adjoining the first principal surface of the second substrate;

thinning the second substrate proceeding from a second principal surface that lies opposite the first principal surface of the second substrate;

producing contacts, that are electrically connected to components in the region of the second principal surface of the second substrate, on the second principal surface of the second substrate;

securing said first carrier plate on the second principal surface of the second substrate such that said first substrate and said second substrate are arranged at opposite sides of said first carrier plate; and forming terminal pads, that are electrically connected to at least one conductive fill and that meet at least one contact on the second principal surface of the second substrate and that are joined to the at least one contact, on that surface of said first carrier plate adjoining the second principal surface of said second substrate.

7. The method according to claim 6, wherein at least some of the terminal pads of at least one of the first and second carrier plates are structured such that the terminal pads are electrically connected to conductive fills of neighboring pores, so that the terminal pads are connected in parallel.

8. The method according to claim 7, wherein at least one of the first and second carrier plates projects laterally beyond at least one of the neighboring substrates.

9. The method according to claim 8, wherein the laterally projecting carrier plate has at least one terminal contact in the laterally projecting carrier part that is connected via a metallization level to components in at least one of the first and second substrates.

10. A method for manufacturing a cubically integrated circuit arrangement, comprising the steps of:

producing through pores in a doped monocrystalline silicon wafer by electrochemical etching in a fluoride-containing, acidic electrolyte wherein the silicon wafer is connected as an anode;

at least partially providing said through pores with conductive fills, said conductive fills being selected from the group of doped polysilicon, aluminum, copper or of amalgam constituents;

thinning a first substrate proceeding from a second principal surface that lies opposite a first principal surface of the first substrate;

producing contacts, that are electrically connected to components in a region of the first principal surface of the first substrate, on the second principal surface of the first substrate;

securing the silicon wafer, as a first carrier plate, on the first principal surface of the first substrate, the first substrate having the components at least in the region of the first principal surface, the first substrate having contacts to the components on the first principal surface;

forming terminal pads, that are electrically connected to at least one conductive fill and that meet at least one contact on the first principal surface, on a surface of the carrier plate adjoining the first principal surface, said terminal pads being joined to contacts of the contacts on the first substrate.

11. The method according to claim 10, wherein the silicon wafer is thinned by chemical-mechanical polishing.

12. The method according to claim 10, wherein the silicon wafer is thinned by chemical-mechanical polishing.

13. The method according to claim 10, wherein the method further comprises:

securing a second carrier plate that is provided with pores provided with conductive fills substantially in the same way as the first carrier plate, on a first principal surface of a second substrate, the second substrate having components in the region of the first principal surface of the second substrate and having contacts to the components on the first principal surface of the second substrate; and forming terminal pads that are electrically connected to at least one conductive fill, that meet at least one contact on the first principal surface of the second substrate, and that are joined to said at least one contact, at least on that surface of the second carrier plate adjoining the first principal surface of the second substrate;

thinning the second substrate proceeding from a second principal surface that lies opposite the first principal surface of the second substrate;

producing contacts, that are electrically connected to components in the region of the second principal surface of the second substrate, on the second principal surface of the second substrate;

securing said first carrier plate on the second principal surface of the second substrate such that said first substrate and said second substrate are arranged at opposite sides of said first carrier plate; and forming terminal pads, that are electrically connected to at least one conductive fill and that meet at least one contact on the second principal surface of the second substrate and that are joined to the at least one contact, on that surface of said first carrier plate adjoining the second principal surface of said second substrate.

14. The method according to claim 13, wherein at least some of the terminal pads of at least one of the first and second carrier plates are structured such that the terminal pads are electrically connected to conductive fills of neighboring pores, so that the terminal pads are connected in parallel.

15. The method according to claim 14, wherein at least one of the first and second carrier plates projects laterally beyond at least one of the neighboring substrates.

16. The method according to claim 15, wherein the laterally projecting carrier plate has at least one terminal contact in the laterally projecting carrier part that is connected via a metallization level to components in at least one of the first and second substrates.

17. A method for manufacturing a cubically integrated circuit arrangement, comprising the steps of:

producing through pores in a doped monocrystalline silicon wafer by electrochemical etching in a fluoride-containing, acidic electrolyte wherein the silicon wafer is connected as an anode;

at least partially providing said through pores, insulated from the silicon wafer, with conductive fills;

securing the silicon wafer, as a first carrier plate, on a first principal surface of a first substrate, the first substrate having components at least in a region of the first principal surface, the first substrate having contacts to the components on the first principal surface;

forming terminal pads, that are electrically connected to at least one conductive fill and that meet at least one contact on the first principal surface, on the surface of the carrier plate adjoining the first principal surface, said terminal pads being joined to the contacts on the first substrate;

securing a second carrier plate that is provided with pores provided with conductive fills substantially in the same way as the first carrier plate, on a first principal surface of a second substrate, the second substrate having components in the region of the first principal surface of the second substrate and having contacts to the components on the first principal surface of the second substrate;

forming terminal pads that are electrically connected to at least one conductive fill, that meet at least one contact on the first principal surface of the second substrate, and that are joined to said at least one contact, at least on that surface of the second carrier plate adjoining the first principal surface of the second substrate;

thinning the second substrate proceeding from a second principal surface that lies opposite the first principal surface of the second substrate;

producing contacts, that are electrically connected to components in the region of the second principal surface of the second substrate, on the second principal surface of the second substrate;

securing said first carrier plate on the second principal surface of the second substrate such that said first substrate and said second substrate are arranged at opposite sides of said first carrier plate; and forming terminal pads, that are electrically connected to at least one conductive fill and that meet at least one contact on the second principal surface of the second substrate and that are joined to the at least one contact, on that surface of said first carrier plate adjoining the second principal surface of said second substrate.

18. The method according to claim 17, wherein at least some of the terminal pads of at least one of the first and second carrier plates are structured such that the terminal pads are electrically connected to conductive fills of neighboring pores, so that the terminal pads are connected in parallel.

19. The method according to claim 18, wherein at least one of the first and second carrier plates projects laterally beyond at least one of the neighboring substrates.

20. The method according to claim 19, wherein the laterally projecting carrier plate has at least one terminal contact in the laterally projecting carrier part that is connected via a metallization level to components in at least one of the first and second substrates.

* * * * *